(12) United States Patent
Sentoku et al.

(10) Patent No.: US 7,010,380 B2
(45) Date of Patent: Mar. 7, 2006

(54) MANAGEMENT SYSTEM, MANAGEMENT METHOD AND APPARATUS, AND MANAGEMENT APPARATUS CONTROL METHOD

(75) Inventors: Koichi Sentoku, Tochigi (JP); Hideki Ina, Kanagawa (JP); Takehiko Suzuki, Saitama (JP); Takahiro Matsumoto, Tochigi (JP); Satoru Oishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/423,891

(22) Filed: Apr. 28, 2003

(65) Prior Publication Data

US 2003/0204488 A1    Oct. 30, 2003

(30) Foreign Application Priority Data

Apr. 30, 2002    (JP)    .............................. 2002-129327

(51) Int. Cl.
   G06F 19/00    (2006.01)
   G06F 17/50    (2006.01)

(52) U.S. Cl. ........................................ 700/121; 716/21
(58) Field of Classification Search ............ 700/95–97, 700/108, 109, 121, 28, 32, 44, 45, 52; 702/81, 702/84, 182; 716/21; 382/145
   See application file for complete search history.

(56) References Cited

U.S. PATENT DOCUMENTS

| | | | |
|---|---|---|---|
| 4,634,240 A | 1/1987 | Suzuki et al. ................ | 350/508 |
| 4,635,373 A | 1/1987 | Miyazaki et al. .......... | 33/180 R |
| 4,645,924 A | 2/1987 | Suzuki et al. ................ | 250/236 |
| 4,669,883 A | 6/1987 | Ina et al. ..................... | 356/401 |
| 4,669,885 A | 6/1987 | Ina .............................. | 356/443 |
| 4,834,540 A | 5/1989 | Totsuka et al. ............. | 356/401 |
| 4,861,162 A | 8/1989 | Ina .............................. | 356/401 |
| 4,886,974 A | 12/1989 | Ina .............................. | 250/561 |
| 4,901,109 A | 2/1990 | Mitome et al. ............... | 355/68 |
| 4,958,160 A | 9/1990 | Ito et al. ....................... | 355/53 |
| 5,243,377 A | 9/1993 | Umatate et al. ............. | 355/53 |

(Continued)

FOREIGN PATENT DOCUMENTS

EP    1 248 154 A1    10/2002

(Continued)

OTHER PUBLICATIONS

Translation of JP 2000-306815.*

(Continued)

*Primary Examiner*—Leo Picard
*Assistant Examiner*—Ryan A. Jarrett
(74) *Attorney, Agent, or Firm*—Fitzpatrick, Cella, Harper & Scinto

(57) ABSTRACT

A system which manages a plurality of semiconductor exposure apparatuses holds TIS information representing the characteristics of the respective semiconductor exposure apparatuses. In a semiconductor exposure apparatus, a parameter value is optimized on the basis of AGA measurement results obtained using a set parameter value and another parameter value and AGA measurement estimation results obtained by virtually changing the parameter value. Whether to reflect the optimized parameter value in another exposure device is decided on the basis of the TIS information. If it is decided to reflect the optimized parameter value, the parameter value of another semiconductor exposure apparatus is optimized by the optimized parameter value. In this manner, the optimization result of a parameter value by a given exposure device can be properly reflected in another exposure device, realizing efficient parameter value setting.

16 Claims, 11 Drawing Sheets

U.S. PATENT DOCUMENTS

| | | | |
|---|---|---|---|
| 5,586,059 A | 12/1996 | Oshelski et al. | 364/552 |
| 5,659,384 A | 8/1997 | Ina | 355/53 |
| 5,682,239 A | 10/1997 | Matsumoto et al. | 356/349 |
| 5,742,406 A | 4/1998 | Suzuki | 356/468 |
| 5,847,974 A | 12/1998 | Mori et al. | 364/571.02 |
| 5,937,069 A | 8/1999 | Nagai et al. | 380/49 |
| 6,124,922 A | 9/2000 | Sentoku | 355/53 |
| 6,151,120 A | 11/2000 | Matsumoto et al. | 356/399 |
| 6,154,281 A | 11/2000 | Sentoku et al. | 356/401 |
| 6,198,181 B1 | 3/2001 | Ali et al. | 310/42 |
| 6,223,133 B1 | 4/2001 | Brown | 702/85 |
| 6,275,988 B1 | 8/2001 | Nagashima et al. | 725/8 |
| 6,311,096 B1 | 10/2001 | Saxena et al. | 700/121 |
| 6,344,892 B1 | 2/2002 | Sugita et al. | 355/53 |
| 6,470,230 B1 | 10/2002 | Toprac et al. | 700/121 |
| 6,493,065 B1 | 12/2002 | Ina et al. | 355/53 |
| 6,559,924 B1 | 5/2003 | Ina et al. | 355/53 |
| 6,563,573 B1 | 5/2003 | Morohoshi et al. | 356/124 |
| 6,607,926 B1 * | 8/2003 | Toprac et al. | 438/7 |
| 6,785,583 B1 | 8/2004 | Oishi et al. | 700/108 |
| 2001/0043326 A1 | 11/2001 | Ina et al. | 356/237.4 |
| 2002/0046140 A1 | 4/2002 | Kano et al. | 705/27 |
| 2002/0051125 A1 | 5/2002 | Suzuki | 355/53 |
| 2002/0100013 A1 * | 7/2002 | Miwa et al. | 716/21 |
| 2002/0111038 A1 * | 8/2002 | Matsumoto et al. | 438/763 |
| 2002/0175300 A1 | 11/2002 | Suzuki et al. | 250/548 |
| 2002/0176096 A1 | 11/2002 | Sentoku et al. | 356/620 |
| 2002/0180983 A1 | 12/2002 | Ina et al. | 356/511 |
| 2003/0012373 A1 | 1/2003 | Ogura et al. | 380/30 |
| 2003/0022396 A1 * | 1/2003 | Ogawa | 438/7 |
| 2003/0071980 A1 | 4/2003 | Ina et al. | 355/53 |
| 2003/0119216 A1 * | 6/2003 | Weed | 438/14 |
| 2003/0121022 A1 * | 6/2003 | Yoshitake et al. | 716/21 |
| 2003/0204282 A1 * | 10/2003 | Oishi et al. | 700/108 |

FOREIGN PATENT DOCUMENTS

| | | | |
|---|---|---|---|
| JP | 2000-306815 | * | 11/2000 |
| JP | 200306815 | * | 11/2000 |
| KR | 2003-0032871 | | 4/2003 |

OTHER PUBLICATIONS

European Search Report dated Jul. 4, 2005, issued in corresponding European patent application No. EP 03 00 9611, forwarded in a Communication dated Jul. 22, 2005.

Lee, C., et al., "Reducing CD Variation via Statistically Matching Steppers," *SPIE*, vol. 1261, *Integrated Circuit Metrology, Inspection and Process Control IV*, (Mar. 1990). pp. 63-70.

van den Brink, M.A., et al. "Matching Management of Multiple Wafer Steppers Using a Stable Standard and a Matching Simulator," *SPIE*, vol. 1087, *Integrated Circuit Metrology, Inspection, and Process Contol III* (Feb. 1989). pp. 218-232.

Korean Office Action dated May 23, 2005, issued in a corresponding Korean patent application, No. 10-2003-0027396, with English translation.

* cited by examiner

| APPARATUS NAME | COMA | SPHERICAL ABERRATION | ASTIG-MATISM | CIS | Telecentricity |
|---|---|---|---|---|---|
| SEMICONDUCTOR EXPOSURE APPARATUS 1 | CM1 | SA1 | A1 | C1 | T1 |
| SEMICONDUCTOR EXPOSURE APPARATUS 2 | CM2 | SA2 | A2 | C2 | T2 |
| | ⋮ | ⋮ | ⋮ | ⋮ | ⋮ |
| SEMICONDUCTOR EXPOSURE APPARATUS x | CMx | SAx | Ax | Cx | Tx |

F I G. 10A
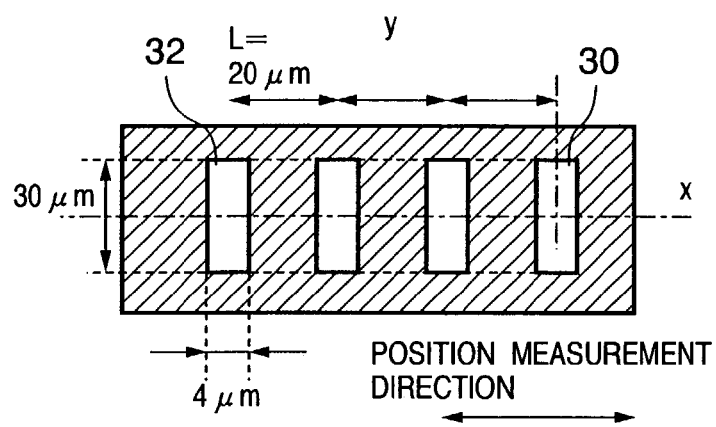
F I G. 10B
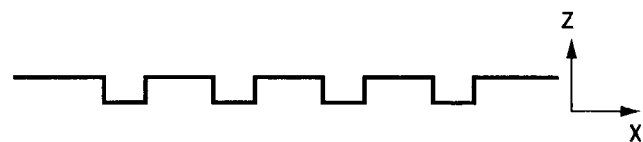

MANAGEMENT SYSTEM, MANAGEMENT METHOD AND APPARATUS, AND MANAGEMENT APPARATUS CONTROL METHOD

FIELD OF THE INVENTION

The present invention relates to a management system and management method for managing an industrial device and, more particularly, to effective alignment in an exposure apparatus.

BACKGROUND OF THE INVENTION

Circuit micropatterning and an increase in density require an exposure apparatus for manufacturing a device to project a circuit pattern formed on a reticle onto a wafer at a higher resolving power. The circuit pattern resolving power depends on the wavelength of exposure light and the NA (Numerical Aperture) of a projection optical system for projecting a reticle pattern onto a wafer. The resolving power is increased by increasing the NA of the projection optical system or shortening the wavelength of exposure light. As for the latter method, the exposure light source is shifting from a g-line lamp to an i-line lamp, and further from the i-line lamp to an excimer laser. As the excimer laser, a KrF excimer laser and an ArF excimer laser having oscillation wavelengths of 248 nm and 193 nm, respectively, are available and have already been used as a light source for an exposure apparatus.

At present, a VUV (Vacuum Ultra Violet) exposure apparatus using an $F_2$ excimer laser with a shorter oscillation wavelength of 157 nm, and an EUV (Extreme Ultra Violet) exposure apparatus using an EUV light source (e.g., a laser plasma light source, pinch plasma light source, or synchrotron light source) with a wavelength of 13 nm are examined as next-generation exposure apparatuses.

Along with circuit micropatterning, demands have also arisen for aligning at a high precision a reticle on which a circuit pattern is formed and a wafer onto which the circuit pattern is projected. The necessary precision is generally ⅓ the circuit line width. For example, the necessary precision in a 180-nm design rule is ⅓, i.e., 60 nm.

Various device structures have been proposed and examined for commercial use. With the spread of personal computers and the like, micropatterning has shifted from memories such as a DRAM to CPU chips. For further IT revolution, circuits will be further micropatterned by the development of MMIC (Millimeter-wave Monolithic Integrated Circuits), and the like, used in communication system devices called a home wireless LAN and Bluetooth, highway traffic systems (ITS: Intelligent Transport Systems) represented by a car radar using a frequency of 77 GHz, and wireless access systems (LMDS: Local Multipoint Distribution Service) using a frequency of 24 GHz to 38 GHz.

There are also proposed various semiconductor device manufacturing processes. As a planarization technique which solves an insufficient depth of the exposure apparatus, the W-CMP (Tungsten Chemical Mechanical Polishing) process has already been a past technique. Instead, the Cu dual damascene process has received a great deal of attention.

Various semiconductor device structures and materials are used. For example, there are proposed a P-HEMT (Pseudo-morphic High Electron Mobility Transistor) and M-HEMT (Metamorphe-HEMT) which are formed by combining compounds such as GaAs and InP, and an HBT (Heterojunction Bipolar Transistor) using SiGe, SiGeC, and the like.

Under the present circumstance of the semiconductor industry, many apparatus parameters must be set in correspondence with each exposure method and each product in the use of a semiconductor manufacturing apparatus such as an exposure apparatus. The parameters are not independent of each other but are closely related to each other.

These parameter values have conventionally been decided by trial and error by the person in charge of a device manufacturer. A long time is taken to decide optimal parameter values. If, e.g., a process error occurs after the parameter values are decided, the manufacturing process is changed in accordance with the error. With this change, the parameter values of the manufacturing apparatus must be changed again. Also, in this case, a long time is taken to decide optimal parameter values.

In the semiconductor device production, the time which can be taken until the start of volume production after the activation of a manufacturing apparatus is limited. The time which can be taken to decide the parameter value of each parameter is also limited. In terms of CoO (Cost of Ownership), the operating time of the manufacturing apparatus must be prolonged. To change a parameter value which has already been decided, it must be quickly changed. In this situation, it is very difficult to manufacture various semiconductor devices with an optimal parameter value of each parameter. Even a manufacturing apparatus which can originally achieve a high yield is used without optimizing the parameter value of each parameter, decreasing the yield. Such low yield leads to a high manufacturing cost, a small shipping amount, and weak competitiveness.

SUMMARY OF THE INVENTION

The present invention has been made to overcome the conventional drawbacks, and has as its illustrative object to allow properly reflecting the optimization result of the parameter value of a predetermined parameter by a given industrial device in another industrial device, and efficiently setting the parameter value.

It is another illustrative object of the present invention to allow optimizing the parameter value of a predetermined parameter during volume production by an industrial device and properly reflecting the parameter value in another industrial device.

According to the present invention, the foregoing object is attained by providing a management system which manages a plurality of industrial devices, comprising:

a plurality of industrial devices connected to a network; and reflection means for reflecting a change in a parameter value of one of the plurality of industrial devices in at least one remaining industrial device.

According to the present invention, the foregoing object is attained by providing a management method of managing a plurality of industrial devices connected to a network, comprising:

a change step of changing a parameter value of one of the plurality of industrial devices; and a reflection step of reflecting the change in the change step in at least one remaining industrial device.

According to the present invention, the foregoing object is attained by providing a management apparatus which manages a plurality of industrial devices, comprising:

connection means for connecting the plurality of industrial devices via a network; and reflection means for reflecting a change in a parameter value of one of the plurality of industrial devices in at least one remaining industrial device.

According to the present invention, the foregoing object is attained by providing a method of controlling a management apparatus which manages a plurality of industrial devices connected to a network, comprising:

a change step of changing a parameter value of one of the plurality of industrial devices; and a reflection step of reflecting, in at least one remaining industrial device via the network, the change in the parameter value of one of the plurality of industrial devices in the change step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10A is a view showing an alignment mark 14;

FIG. 10B is a sectional view showing the sectional structure of the alignment mark 14;

DETAILED DESCRIPTION OF THE PREFERRED EMBODIMENTS

Preferred embodiments of the present invention will now be described in detail in accordance with the accompanying drawings.

<First Embodiment>

Figure 1:
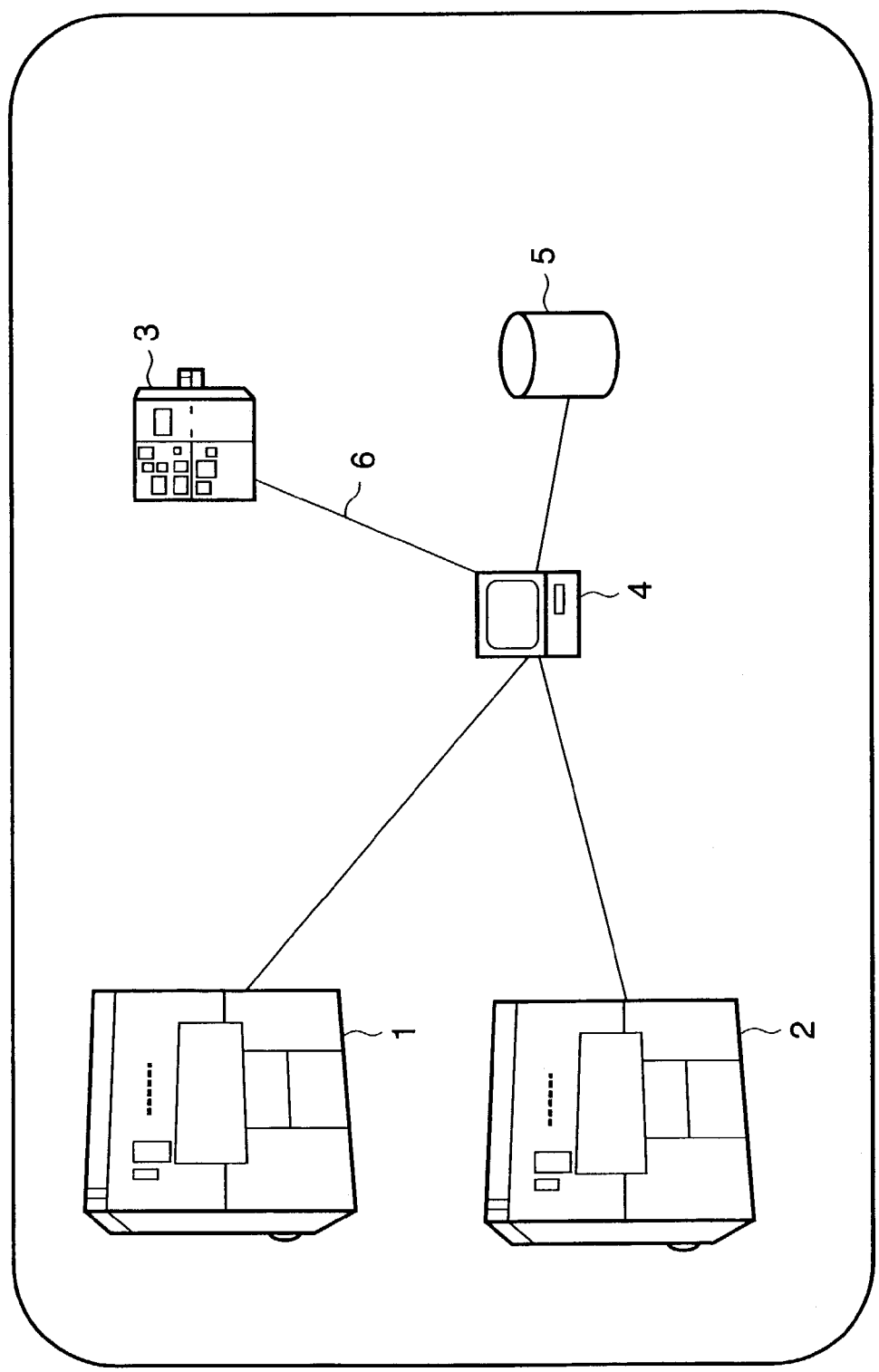
FIG. 1 is a view showing the schematic arrangement of an overall exposure management system according to the first embodiment.
Figure 2:
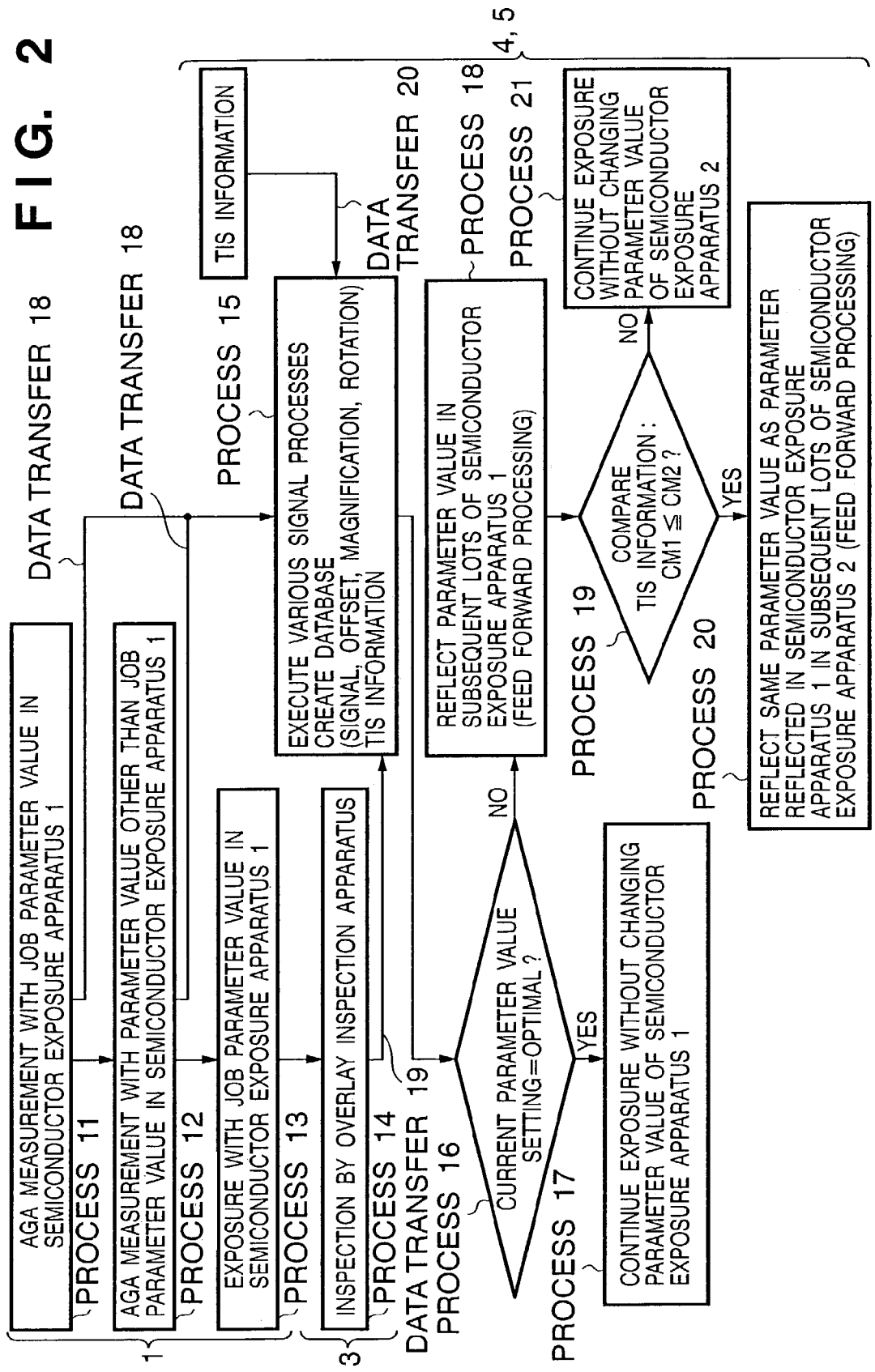
FIG. 2 is a flow chart for explaining processing of deciding an optimal parameter value and deciding whether to reflect the parameter value in a semiconductor exposure apparatus in a semiconductor manufacturing system according to the first embodiment.

FIGS. 1 and 2 show a semiconductor manufacturing system according to the first embodiment. In the following description, of a management system according to the first embodiment, a system which optimizes an alignment parameter corresponding to a volume production apparatus and is applied to the alignment system of a semiconductor exposure apparatus will be called OAP (Optimization for Alignment Parameter in volume production). Parameters in this specification include parameters which can be set by numerical values, and conditions such as the sample shot layout and alignment method which are not numerical values. Variables also include apparatus variation elements such as a choice, and generation conditions, in addition to numerical values. For example, parameters to be optimized are the mark line width of an alignment mark, the mark width of the alignment mark, the mark element interval of the alignment mark, the layout/number of sample shots in global alignment, the illumination mode (center wavelength, wavelength width, and σ) of an alignment optical system, the signal processing window width, and the signal processing window center distance.

FIG. 1 is a view showing the schematic arrangement of an overall exposure management system according to the first embodiment. The exposure management system of the first embodiment includes a plurality of semiconductor exposure apparatuses (in FIG. 1, semiconductor exposure apparatuses 1 and 2), an overlay inspection apparatus 3, a central processing unit 4, and a database 5, which are connected by a LAN 6 (e.g., an in-house LAN). The central processing unit 4 collects various measurement values and the like from the semiconductor exposure apparatuses 1 and 2 and the overlay inspection apparatus 3, and saves them in the database 5. While the semiconductor exposure apparatuses 1 and 2 operate in volume production, the central processing unit 4 optimizes parameter values, and notifies the semiconductor exposure apparatuses 1 and 2 of them.

Figure 8:
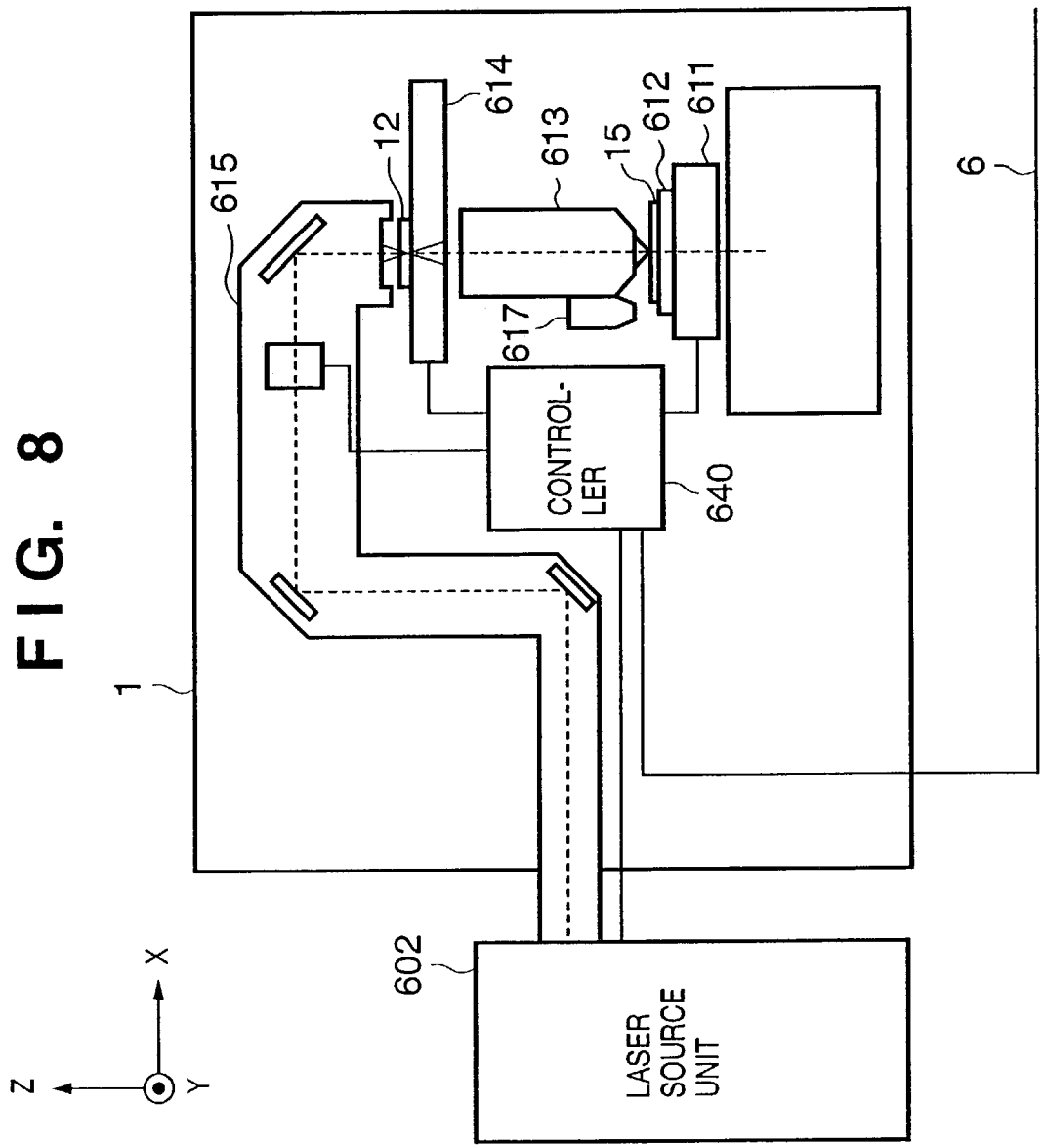
FIG. 8 is a view for explaining the whole arrangement of a semiconductor exposure apparatus subjected to industrial device management according to the first embodiment of the present invention.

FIG. 8 is a view for explaining the whole arrangement of the semiconductor exposure apparatus 1 in FIG. 1. The semiconductor exposure apparatus 1 exposes a wafer 15 to the pattern of a reticle 12.

In FIG. 8, reference numeral 602 denotes a laser source. An emitted laser beam serving as exposure light is shaped by an illumination optical system 615, and irradiates the pattern of the reticle 12.

Figure 9:
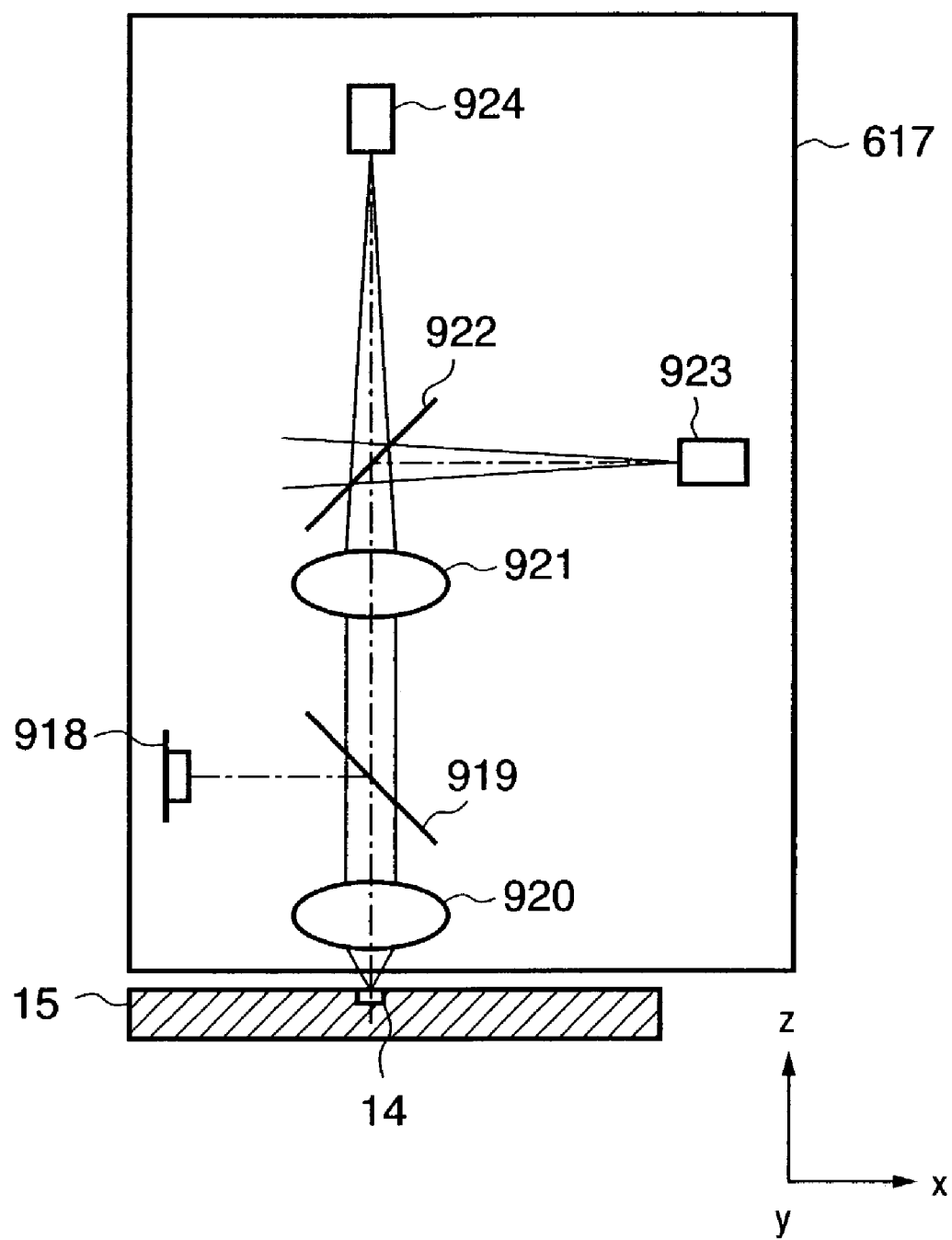
FIG. 9 is a block diagram showing the main building components of an alignment unit 617.

The reticle 12 is held on a stage 614 which can move in a reticle scanning direction within the x-y plane in FIG. 8. Reference numeral 613 denotes a projection system having a predetermined reduction magnification. The pattern of the reticle 12 illuminated via the illumination optical system 615 is projected onto one shot region of the wafer 15 via the projection system 613, and the wafer 15 is exposed to the pattern. The wafer 15 is coated with a resist (photosensitive agent), and a latent image is formed by exposure. The wafer 15 is set on a wafer stage 611 via a wafer chuck 612. Reference numeral 617 denotes an off axis alignment optical system which can detect an alignment mark 14 formed on the wafer 15, as shown in FIG. 9.

The wafer stage 611 can move the set wafer 15 within the stage plane (x- and y-axis directions), in the vertical direction (z-axis direction), and in tilt and rotation directions around the respective axes, controlling positioning. By z-axis positioning of the wafer stage 611, the projection system 613 is focused on the wafer 15.

Note that movement and positioning control of the reticle stage 614 and wafer stage 611 are based on position information obtained by measuring information on the stage position and posture by a sensor (not shown).

Figures 3, 4:
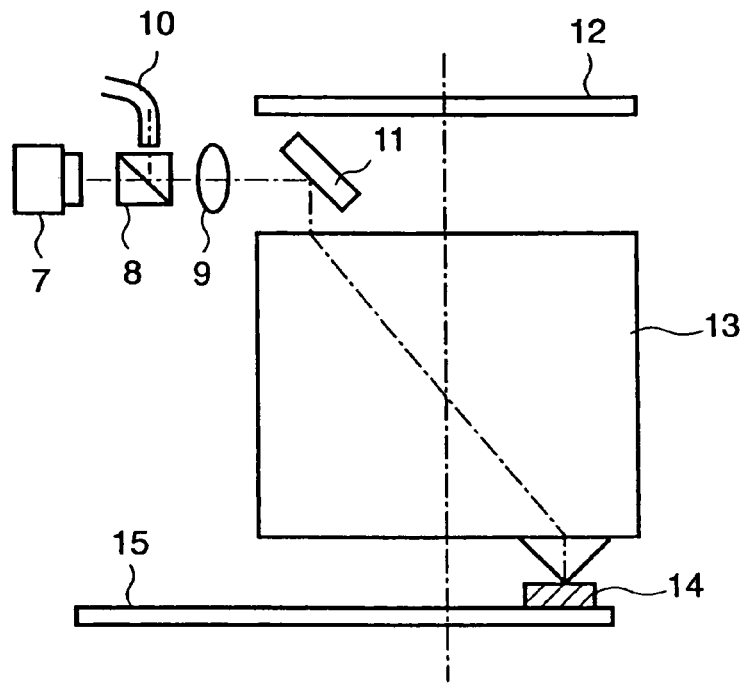
FIG. 3 is a view showing the TTL alignment optical system of the semiconductor exposure apparatus.
FIG. 4 is a table showing apparatus-dependent information (TIS information) of the semiconductor exposure apparatus.

The reticle stage 614 and wafer stage 611 are connected to a controller 640, and exchange data in real time for sync control. The laser source 602 is also connected to the controller 640, and control of the emission timing and control synchronized with movement of the stages 614 and 611 can be achieved. The controller 640 is connected to the LAN 6. Although not shown in FIG. 8, the semiconductor exposure apparatus 1 also comprises a TTL alignment optical system as shown in FIG. 3 (to be described later).

An OAP sequence according to the first embodiment will be explained with reference to FIG. 2. Assume that a wafer to be exposed is loaded into the semiconductor exposure apparatus 1, and a corresponding reticle is set in the semiconductor exposure apparatus (not shown in FIG. 2).

In this state, the semiconductor exposure apparatus performs global alignment called AGA (Advanced Global Alignment) with a parameter value set for a job. A wafer magnification, wafer rotation, and shift amount (all of which will be called AGA measurement results ($\alpha$)) at this time are obtained (process 11). In this example, the wafer position is measured at the precision of an X-Y stage equipped with a laser interferometer. The AGA measurement results ($\alpha$) are transferred to the PC/WS 4 which controls OAP (data transfer 18).

The stage is driven again by using stage driving information. AGA measurement is performed with a parameter value other than the parameter value set for the job (when, for example, the parameter is the number of sample shots used for AGA, the number is changed from the previously set one), and a wafer magnification, wafer rotation, and shift amount are obtained (process 12). These AGA measurement results ($\beta$) are also transferred to the PC/WS 4, similar to the AGA measurement results ($\alpha$) obtained using the previous parameter value set for the job (data transfer 18). Further, all alignment signals detected in AGA measurement are transferred to the PC/WS 4 (data transfer 18). A system which transfers an alignment signal to the PC/WS 4 for controlling OAP is called ADUL (Alignment Data Up Load). Note that the sample shot is a shot whose position is actually measured in AGA.

After all data are obtained, exposure processing is performed on the basis of the AGA measurement results ($\alpha$) with the parameter value set for the job (process 13). Processes 11 to 13 are executed in the semiconductor exposure apparatuses 1 and 2. An exposed wafer is developed by a developing apparatus (not shown).

The PC/WS 4 stores in the database the received wafer magnification, wafer rotation, and shift amount as AGA measurement results ($\alpha$) and ($\beta$) (process 15). The PC/WS 4 performs, for the alignment signal detected in AGA, another signal processing (corresponding to a change in parameter value) different from processing for the AGA measurement results ($\alpha$) and ($\beta$). The PC/WS 4 estimates AGA measurement results ($\gamma$) as a pseudo wafer magnification, wafer rotation, and shift amount, and stores them in the database (process 15). Another signal processing includes a change in window width which restricts the signal range used in signal processing, though the processing method is the same (signal processing may be changed by changing the signal processing method).

The developed wafer is inspected by the overlay inspection apparatus 3 to measure an alignment result (inspection result) (process 14). The inspection result is transferred to the PC/WS 4 (data transfer 19), and stored in the database in correspondence with the AGA measurement results ($\alpha$) by the semiconductor exposure apparatus that have already been stored in the database (process 15).

Pieces of performance information held by the alignment systems of all semiconductor exposure apparatuses are registered in the database 5. These pieces of information are also properly transferred to the PC/WS 4 (data transfer 20), and used as information for deciding a parameter value. TIS (Tool Induced Shift) information means "information held by the alignment system of each semiconductor exposure apparatus". In the first embodiment, "information held by the alignment system of each semiconductor exposure apparatus" concerns the characteristics of an alignment optical system as shown in FIG. 3 or 9. This information will be called TIS information hereinafter.

A TTL alignment optical system according to the first embodiment will be described with reference to FIG. 3. FIG. 3 is an enlarged view showing the semiconductor exposure apparatus 1 having a projection optical system 13 for projecting the pattern of the reticle 12 onto the wafer 15. The alignment method is TTL (Through The Lens) in which an alignment mark is detected via the projection optical system 13. The alignment optical system includes an image sensing element 7, a beam splitter 8, a lens 9, a mirror 11, and an illumination optical system 10 which introduces alignment light. The image of the alignment mark 14 on the wafer 15 is detected by the image sensing element 7 of the alignment optical system via the projection optical system 13 to perform image processing, thereby obtaining the position of the alignment mark 14. The semiconductor exposure apparatus aligns the reticle 12 and wafer 15 on the basis of the result.

To form a high-quality alignment mark image in the TTL alignment optical system, the alignment optical system is adjusted such that aberration of alignment light generated in the projection optical system is reversely corrected within the alignment optical system. This adjustment makes aberration fall within specifications in shipping. However, the remaining aberration is not 0. Synergic operation between the remaining aberration and an alignment mark measurement value error (to be referred to as WIS (Wafer Induced Shift) hereinafter) caused by the semiconductor process changes the error amount in alignment mark detection for each semiconductor exposure apparatus even if, e.g., the WIS error is unchanged for all wafers or within the lot.

From this, TIS information is grasped in advance, a decision to be described later is performed in accordance with the amount, and the parameter value can be changed in correspondence with each semiconductor exposure apparatus. TIS information includes coma, spherical aberration, astigmatism, and CIS (Chromatic Image Shift) of an alignment optical system (including a projection optical system) as shown in FIG. 4, aberrations such as telecentricity, and optical characteristics. Particularly, CIS represents the chromatic aberration amount generated when an optical component in the alignment optical system tilts. It turns out that CIS and the alignment offset amount in alignment by a semiconductor exposure apparatus correlate to each other.

Referring back to FIG. 2, the PC/WS 4 decides whether the currently used parameter value set for the job is optimal, on the basis of a comparison between AGA measurement results (including AGA measurement results (α) with a set parameter value, AGA measurement results (β) with an unset parameter value, and pseudo AGA measurement results (γ) by signal processing), and the inspection result of an actual alignment error measured by the overlay inspection apparatus 3 (process 16). If the parameter values currently used in the semiconductor exposure apparatus 1 are optimal as a result of the decision, exposure continues without changing the parameter values of the semiconductor exposure apparatus 1 (process 17).

If the current parameter values are decided in process 16 to be changed, i.e., a parameter value predicted to obtain a better alignment result exists other than the set parameter value, an optimal parameter value calculated by the PC/WS 4 is reflected in the semiconductor exposure apparatus 1 in processing of subsequent lots (process 18). This is parameter value optimization processing in the semiconductor exposure apparatus 1.

A process of reflecting the result of parameter value optimization processing in another semiconductor exposure apparatus (semiconductor exposure apparatus 2) will be explained. In this processing, whether to change the parameter value of the semiconductor exposure apparatus 2 is decided by comparing, e.g., the coma amount as one of the pieces of TIS information of the alignment optical system (process 19). Letting CM1 be the coma amount of the semiconductor exposure apparatus 1, and CM2 be the coma amount of the semiconductor exposure apparatus 2, the same parameter value as the parameter value reflected in the semiconductor exposure apparatus 1 is also reflected in the semiconductor exposure apparatus 2 for CM1=CM2 or CM1<CM2 (process 20). For CM1>CM2, no parameter value of the semiconductor exposure apparatus 2 is changed (process 21).

When a parameter whose parameter value is to be changed is highly correlated with the coma amount, it is preferable to decide that a parameter value which is set in the semiconductor exposure apparatus 2 and decided not to be optimal in the semiconductor exposure apparatus 1 is not optimal as far as the semiconductor exposure apparatus 2 has a coma amount larger than or equal to that of the semiconductor exposure apparatus 1. A change in parameter value in the semiconductor exposure apparatus 1 can also be decided to be similar or more effective for optimization in the semiconductor exposure apparatus 2. Hence, a change in parameter in the semiconductor exposure apparatus 1 is also reflected in the semiconductor exposure apparatus 2. To the contrary, when the coma amount of the semiconductor exposure apparatus 2 is small, a change in the value of a parameter highly correlated with the coma amount is not so effective in optimization, and it is decided to maintain the current state which has already been optimized. In this case, no parameter value is changed in the semiconductor exposure apparatus 2.

By repeating the above processing, a combination of parameter values is optimized for subsequent lots even upon process variations. Whether to reflect a parameter value optimized for one semiconductor exposure apparatus in another semiconductor exposure apparatus is decided on the basis of TIS information. The parameter value is reflected in a semiconductor exposure apparatus decided to reflect a parameter value. A parameter value in a semiconductor exposure apparatus within the system is efficiently optimized.

Note that the number of semiconductor exposure apparatuses in the exposure management system is not limited to two. Pieces of TIS information for three or more semiconductor exposure apparatuses are managed, and optimization processing of one semiconductor exposure apparatus is applied to the remaining semiconductor exposure apparatuses. At this time, whether to execute optimization of a parameter in each semiconductor exposure apparatus is decided on the basis of TIS information as described above. A parameter value in a semiconductor exposure apparatus decided to execute optimization is similarly changed and optimized.

In the first embodiment, whether to reflect a parameter value in subsequent lots is decided by comparing the numerical value of the coma amount. This criterion may be appropriately changed on the basis of information accumulated in the database 5. For example, if subsequent data exhibits that even a change in parameter value in semiconductor exposure apparatuses having the same coma amount does not improve the alignment result or the necessity of optimization processing in an apparatus increases, no change in parameter value for optimization is performed in semiconductor exposure apparatuses having the same coma amount. Alternatively, if the alignment result is not improved, the criterion is changed in consideration of both the coma value and spherical aberration value. The number of overlay inspection apparatuses 3 and the number of PC/WSs 4 within the system may also be increased, as needed.

The TTL alignment system is illustrated in FIG. 3, in the first embodiment, but the alignment system is not limited to this. The parameter value optimization method can be applied to, e.g., an offaxis alignment system.

The principle of measuring the position of an alignment mark by an offaxis alignment optical system will be explained with reference to FIG. 9. FIG. 9 is a block diagram showing the main building components of the offaxis alignment optical system 617. Illumination light from a light source 918 is reflected by a beam splitter 919, passes through a lens 920, and illuminates the alignment mark 14 on the wafer 15. Diffracted light from the alignment mark 14 passes through the lens 920, the beam splitter 919, and a lens 921, is split by a beam splitter 922, and received by CCD sensors 923 and 924. The alignment mark 14 is enlarged by the lenses 920 and 921 at an imaging magnification of about 100, and forms images on the CCD sensors 923 and 924. The CCD sensors 923 and 924 measure the X and Y positions of the alignment mark 14, respectively. One sensor is rotated through 90° around the optical axis with respect to the other sensor.

The measurement principle is the same between the X and Y directions, and X position measurement will be described. The position measurement alignment mark 14 will be explained. As shown in FIG. 10A, the alignment mark 14 in the first embodiment is comprised of a plurality of (in FIG. 10A, four) stripe-shaped position detection marks (to be also referred to as "elements" of the alignment mark) 32 which are 4 $\mu$m in the alignment measurement direction (X direction) and 30 $\mu$m in the non-measurement direction (Y direction) and are arrayed in the X direction at a preset interval (L=20 $\mu$m). As shown in FIG. 10B, the sectional structure of each element 32 is recessed by etching, and the element 32 is coated with a resist (not shown).

Figure 11:
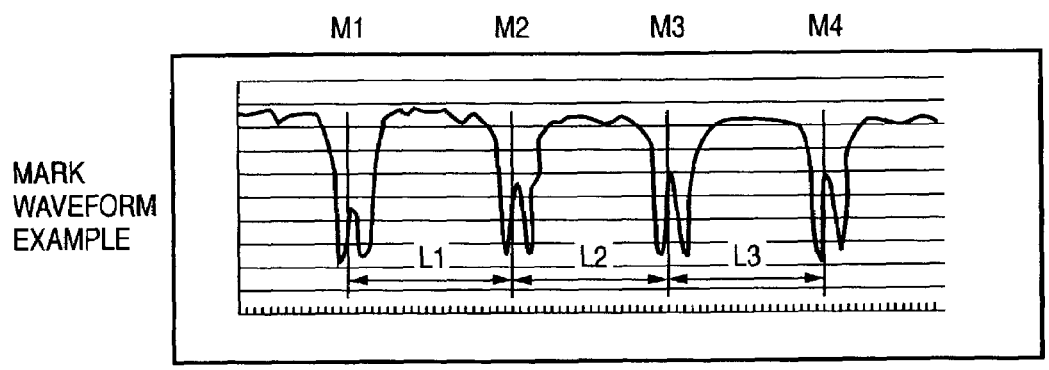
FIG. 11 is a chart showing an alignment signal.

FIG. 11 shows an alignment signal attained by receiving, by the CCD sensors 923 and 924, reflected light obtained by irradiating a plurality of position detection marks 32 with illumination light and photoelectrically converting light. Four mark signals shown in FIG. 11 undergo proper signal processing, and their element positions (M1, M2, M3, and M4 in an order from the left in FIG. 11) are detected. The intervals between these elements (L1, L2, and L3 in an order from the left in FIG. 11) will be called "mark element intervals".

Figure 12C:
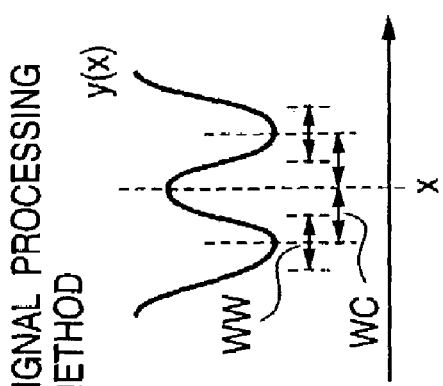
FIG. 12C is an enlarged view showing part of the alignment signal in FIG. 11.
Figure 12B:
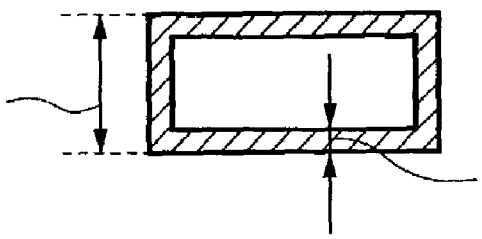
FIG. 12B is a schematic plan view showing a mark element 32.
Figure 12A:
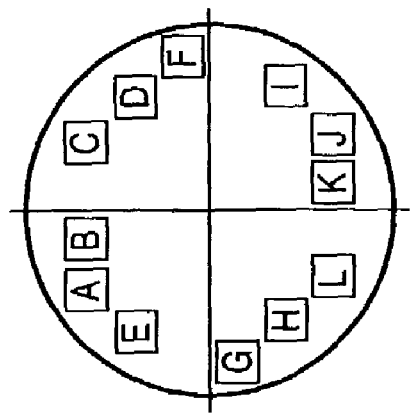
FIG. 12A is a schematic view showing an AGA sample shot layout on a wafer 15.

As shown in FIG. 12A, the above-mentioned parameters include a global alignment sample shot layout considering a combination of shot A to shot L. "Global alignment" is an alignment method of moving a wafer stage to an exposure position on the basis of estimation calculation using position information. FIG. 12A is a schematic view showing an AGA sample shot position on the wafer 15.

The above-mentioned parameters also include the width and line width of the mark element 32. The mark element 32 of the alignment mark 14 shown in FIGS. 10A and 10B is recessed, but a recent process adopts a mark element 32 whose outline only is recessed, in order to eliminate any recess on the wafer surface. For this reason, as shown in FIG. 12B, a mark width ML as the length of the mark element 32 in the alignment measurement direction, and a mark line width MLW as the outline width of the mark element 32 can be alignment parameters. FIG. 12B is a schematic plan view showing the mark element 32.

Further, the above-mentioned parameters include an effective signal processing window width which restricts the signal band used in alignment signal processing, as described above. FIG. 12C is an enlarged view showing a portion M1 of the alignment signal in FIG. 11. The alignment signal is processed to obtain alignment results such as the wafer magnification, wafer rotation amount, and shift amount. If an effective signal processing window width WW representing a portion obtained as an effective signal, or a distance (processing window center distance) WC between the center of the window and the center of the alignment signal is changed, the obtained wafer magnification, wafer rotation amount, and shift amount are also changed. Hence, the signal processing window width WW and signal processing window center distance WC can also be alignment parameters.

Coma is adopted as a criterion for deciding whether to reflect an optimal parameter value in subsequent lots. The criterion is not limited to this, and may be other TIS information shown in FIG. 4. When the criterion is only CIS or telecentricity, a decision relation: CM1≦CM2 (process 19) shown in FIG. 2 is changed to C1≦C2 or T1≦T2. Whether to change a parameter value is decided on the basis of this relation.

The use of the OAP system according to the first embodiment can optimize alignment parameter values without supplying a special wafer (so-called send-ahead wafer) in addition to volume production and examining parameter values, unlike a conventional exposure system. The effective performance of the semiconductor exposure apparatus can be improved without decreasing the productivity in volume production.

<Second Embodiment>

In the first embodiment, whether to reflect a parameter value optimized by a given exposure apparatus in another exposure apparatus is decided. If the parameter value is to be reflected, the optimized parameter value is directly used in another exposure apparatus. In the second embodiment, a parameter value optimized by a given exposure apparatus is multiplied by a coefficient decided on the basis of TIS, i.e., the optimized parameter value is changed in accordance with a TIS comparison result and reflected in another exposure apparatus.

Figure 5:
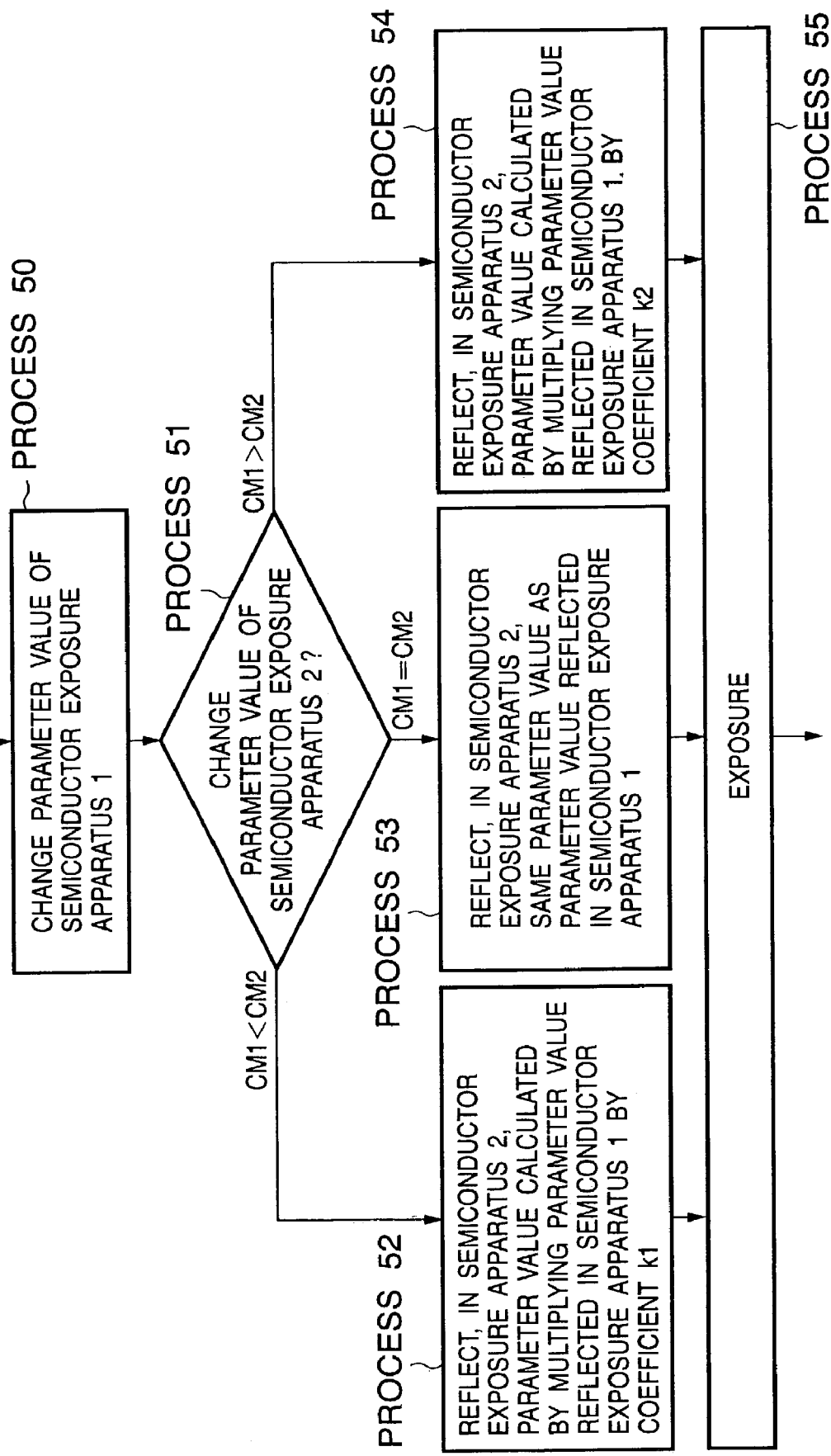
FIG. 5 is a flow chart showing processing of deciding an optimal parameter value and deciding how to reflect the parameter value in another semiconductor exposure apparatus.

The second embodiment of the present invention will be described with reference to FIG. 5. Process 50 in FIG. 5 corresponds to process 18 in FIG. 2.

As described in the first embodiment, a PC/WS 4 uses a designated semiconductor exposure apparatus 1, and decides whether a combination of parameter values more proper than the currently set combination of parameter values exists, on the basis of (1) AGA measurement results acquired using a parameter value (=set parameter value) set for a job and an alignment signal obtained at this time, (2) AGA measurement results acquired using a parameter value (=unset parameter value) other than the parameter value set for the job and an alignment signal obtained at this time, and (3) an inspection result obtained by inspecting by an overlay inspection apparatus 3 an exposed wafer after exposure using the parameter value set for the job (processes 11 to 16). If a more proper combination of parameter values exists, the optimal parameter values are reflected in the semiconductor exposure apparatus 1 (process 50).

After that, a coma amount CM1 as one of the pieces of TIS information of the alignment optical system of an alignment system mounted in the semiconductor exposure apparatus 1, and a coma amount CM2 as one of the pieces of TIS information of the alignment optical system of an alignment system mounted in a semiconductor exposure apparatus 2 are compared to decide how to reflect in the semiconductor exposure apparatus 2 a parameter value reflected in the semiconductor exposure apparatus 1. For example, for CM1<CM2, a parameter value calculated by multiplying a parameter value reflected in the semiconductor exposure apparatus 1 by a coefficient k1 is reflected in the semiconductor exposure apparatus 2 (process 52). For CM1=CM2, the same parameter value as a parameter value reflected in the semiconductor exposure apparatus 1 is also reflected in the semiconductor exposure apparatus 2 (process 53). For CM1>CM2, a parameter value calculated by multiplying a parameter value reflected in the semiconductor exposure apparatus 1 by a coefficient k2 is reflected in the semiconductor exposure apparatus 2 (process 54). Exposure operation is executed using the parameter value set in this way (process 55). Note that the changed parameter value is multiplied by a coefficient, but the parameter value change amount (difference in parameter value before and after change) may be multiplied by a coefficient.

In the second embodiment, a semiconductor exposure apparatus or a parameter value to be fed forward is decided on the basis of the coma amount in TIS information, but may be decided on the basis of other TIS information shown in FIG. 4. The numerical values of the coefficients k1 and k2 to be multiplied by a parameter value may be properly changed to optimal numerical values on the basis of a database accumulated by the PC/WS 4. For example, when the calculated numerical values of the coefficients k1 and k2 become improper upon a change in an optical system, or the like, over time, new coefficients are set, and parameters are changed using them. In this case, the coefficient change direction (increase/decrease) and change amount are decided on the basis of AGA measurement results (including AGA measurement results with set and unset parameter values and pseudo AGA measurement results by signal processing), and data on the correlation between TIS information and a measurement result by the overlay inspection apparatus. If, e.g., the coefficient k1 is multiplied but the result is not improved, 1 may be multiplied next instead of k1 (=directly use a parameter value used in an original apparatus), similar to the first embodiment.

<Third Embodiment>

The third embodiment of the present invention will be described. OAP in the first and second embodiments can be briefly expressed as follows. OAP in the first and second embodiments is a feed forward system. That is, AGA measurement results and alignment signals are acquired in AGA measurement using a parameter value set for a job and AGA measurement using a parameter value other than the parameter value set for the job. Results by an overlay inspection apparatus and the AGA measurement results (which may include pseudo AGA measurement results by signal processing) are compared, and an optimal parameter value is acquired and can be used for subsequent lots.

In "feed forward", no send-ahead wafer is used, but various numerical processes are performed for the results of the preceding lot, and the results of the numerical processes are used in the succeeding lot. "Feed forward" is proposed in consideration of the situation in which the use of an expensive semiconductor exposure apparatus with a long Up Time is superior to preprocessing using a send-ahead wafer in terms of CoO. "Feed forward" can be effectively applied to many volume production sites on the premise that currently set parameters are almost correct.

To the contrary, the third embodiment applies OAP to a feedback system. In the third embodiment, "feedback" means preprocessing. Several wafers called send-ahead wafers are aligned every time exposure of a lot starts. The send-ahead wafers are exposed, an offset is obtained by the overlay inspection apparatus, and the result is input as an offset to the semiconductor exposure apparatus. After that, the remaining wafers in the lot are processed. More specifically, in the third embodiment, AGA measurement results and alignment signals are acquired in AGA measurement of send-ahead wafers using a parameter value set for a job and AGA measurement of the send-ahead wafers using a parameter value other than the parameter value set for the job. Results by the overlay inspection apparatus and the AGA measurement results (which may include pseudo AGA measurement results by signal processing) are compared, and an optimal parameter value is acquired and can be used for AGA measurement of the remaining wafers in the lot.

While CD-SEM measurement is performed especially for a small-capacity lot or the like, an offset is obtained by the overlay inspection apparatus. In this case, the third embodiment can be more effectively applied.

In the above-described embodiments, as TIS information, information obtained in an inspection step in shipping a semiconductor exposure apparatus may be stored in a database. Alternatively, TIS information may be periodically measured using a TIS measurement reference wafer to properly update TIS information in the database 5.

As described above, according to the above-described embodiments, whether a parameter value is optimal can be decided during volume production by an industrial device, and the parameter value can be optimized. Thus, the parameter value can be optimized without any long time and high cost in addition to volume production. The industrial device can be used with high productivity and high apparatus performance. A manufacturing system with good CoO can be achieved.

In the above-described embodiments, the industrial device is a semiconductor exposure apparatus, and the wafer alignment parameter value is optimized. However, the present invention is not limited to them. For example, the present invention may be applied to a CMP apparatus or the wafer focusing function of a semiconductor exposure apparatus.

In OAP described above, an inspection result is obtained by the overlay inspection apparatus. Alternatively, an inspection result may be obtained by, e.g., a scanning electron microscope SEM to optimize a parameter value.

<Semiconductor Device Manufacturing Process>

Figure 6:
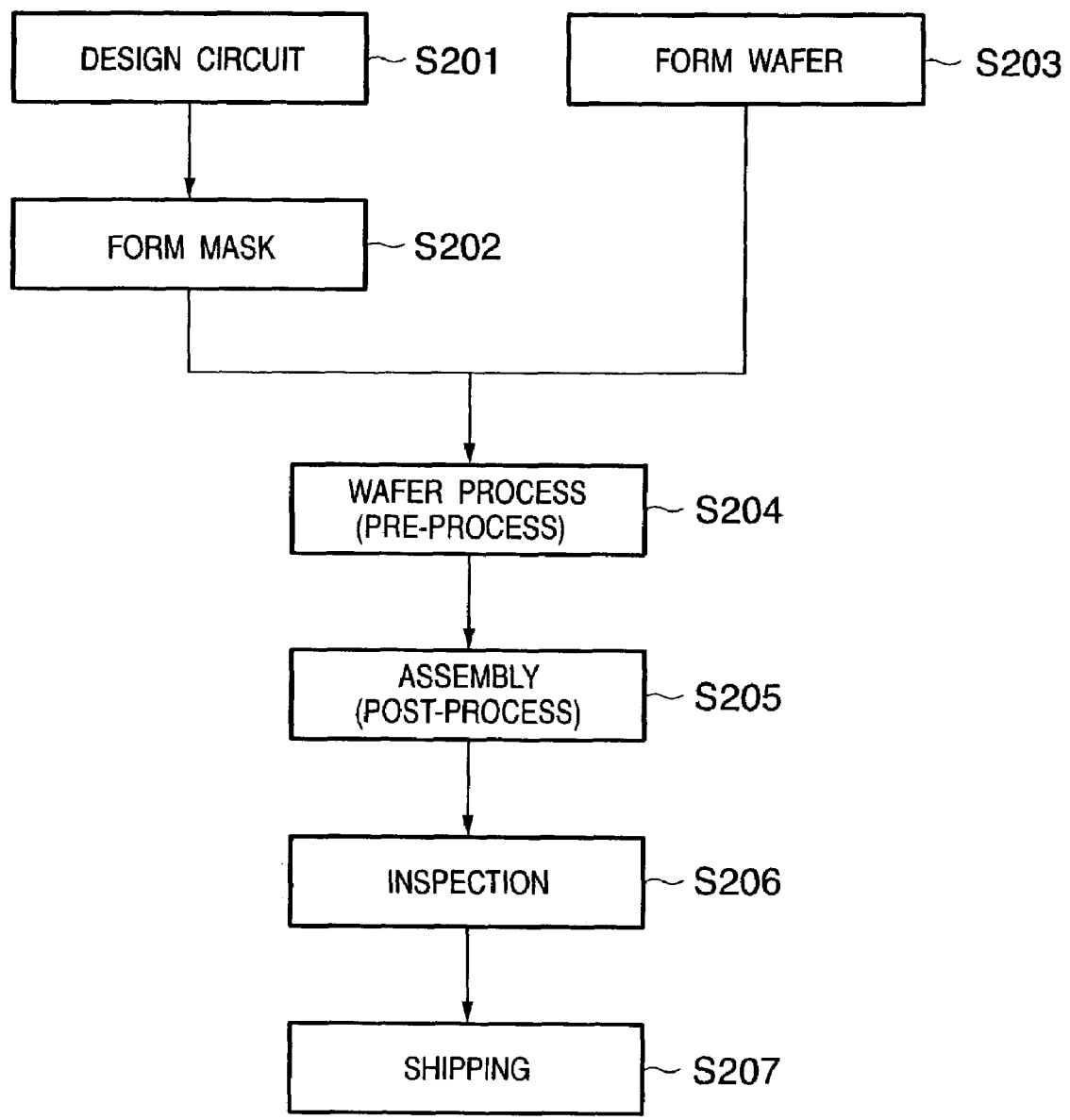
FIG. 6 is a flow chart for explaining the flow of a device manufacturing process.

A semiconductor device manufacturing process using the above-described semiconductor exposure apparatus will be explained. FIG. 6 shows the flow of the whole manufacturing process of a semiconductor device. In step S201 (circuit design), a semiconductor device circuit is designed. In step S202 (mask formation), a mask having the designed circuit pattern is formed. In step S203 (wafer formation), a wafer is formed using a material such as silicon. In step S204 (wafer process), called a pre-process, an actual circuit is formed on the wafer by lithography using the prepared mask and wafer. Step S205 (assembly), called a post-process, is the step of forming a semiconductor chip by using the wafer formed in step S204, and includes an assembly process (dicing and bonding) and a packaging process (chip encapsulation). In step S206 (inspection), the semiconductor device manufactured in step S205 undergoes inspections such as an operation confirmation test and a durability test. After these steps, the semiconductor device is completed and shipped (step S207). For example, the pre-process and post-process are performed in separate dedicated factories, and each of the factories receives maintenance by a remote maintenance system. Information for production management and apparatus maintenance is communicated between the pre-process factory and the post-process factory via the Internet or dedicated network.

Figure 7:
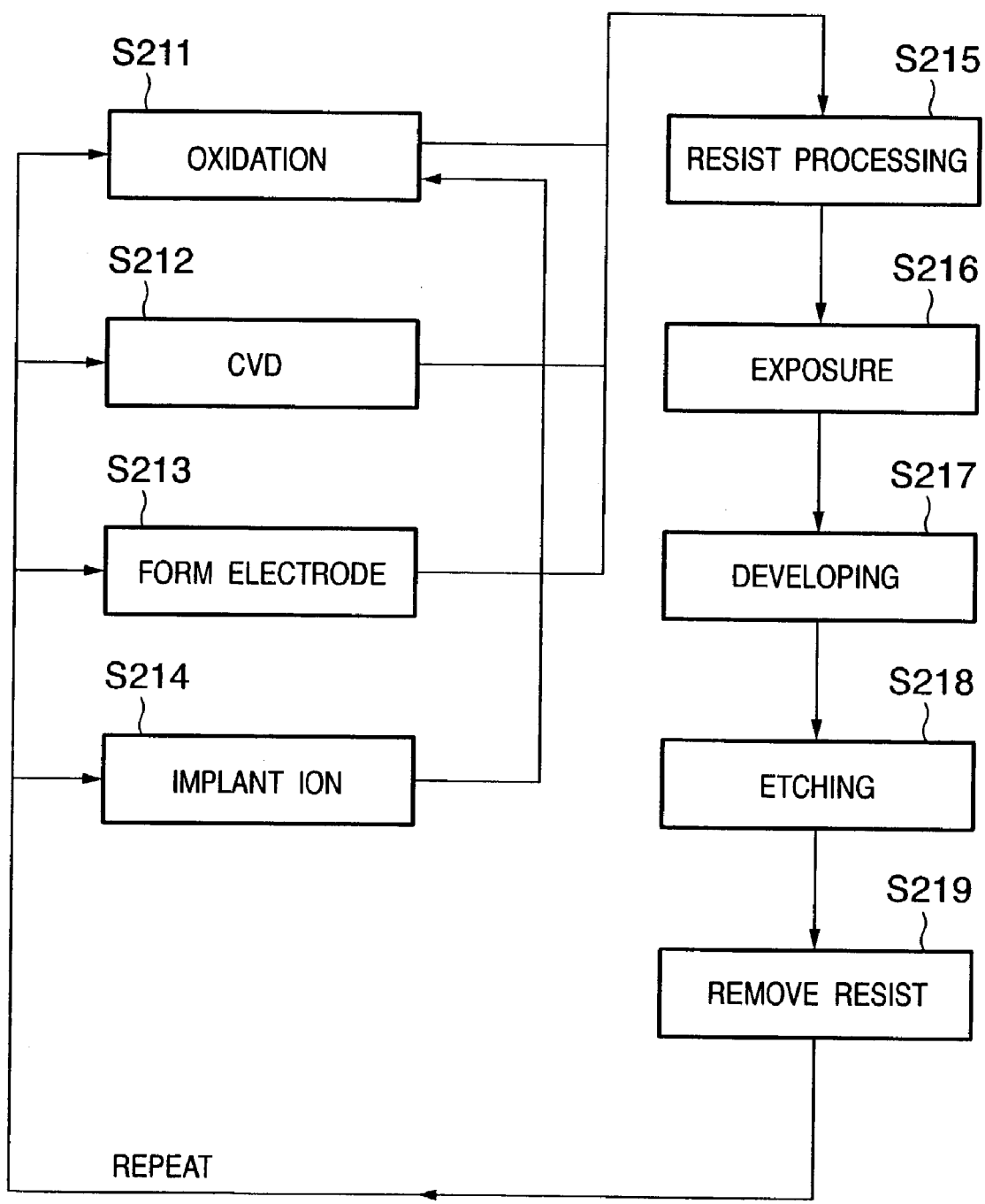
FIG. 7 is a flow chart for explaining a wafer process.

FIG. 7 shows the detailed flow of the wafer process. In step S211 (oxidation), the wafer surface is oxidized. In step S212 (CVD), an insulating film is formed on the wafer surface. In step S213 (electrode formation), an electrode is formed on the wafer by vapor deposition. In step S214 (ion implantation), ions are implanted in the wafer. In step S215 (resist processing), a photosensitive agent is applied to the wafer. In step S216 (exposure), the above-mentioned exposure apparatus exposes the wafer to the circuit pattern of a mask, and prints the circuit pattern on the wafer. In step S217 (developing), the exposed wafer is developed. In step S218 (etching), the resist is etched except the developed resist image. In step S219 (resist removal), an unnecessary resist after etching is removed. These steps are repeated to form multiple circuit patterns on the wafer. The exposure apparatus used in this process is optimized by the above-described management system, which can prevent degradation over time or the like caused by fixed parameters. Even if a change over time occurs, the exposure apparatus can be widely optimized without stopping volume production, increasing the semiconductor device productivity in comparison with the prior art.

The above-described embodiments have exemplified, as the exposure apparatus, a semiconductor exposure apparatus for forming a semiconductor device on a wafer serving as a substrate. The present invention can also be applied to another exposure apparatus such as an exposure apparatus for exposing a glass substrate to produce a liquid crystal display, an exposure apparatus for forming an integrated circuit on the spherical surface of a spherical semiconductor serving as a substrate, or a charged-particle beam exposure apparatus using an electron beam or ion beam as a light source.

The object of the present invention is also achieved when a storage medium which stores software program codes for realizing the functions of the above-described embodiments is supplied to a system or apparatus, and the computer (or the CPU or MPU) of the system or apparatus reads out and executes the program codes stored in the storage medium.

In this case, the program codes read out from the storage medium realize the functions of the above-described embodiments, and the storage medium which stores the program codes constitutes the present invention.

The storage medium for supplying the program codes includes a floppy disk, a hard disk, an optical disk, a magnetooptical disk, a CD-ROM, a CD-R, a magnetic tape, a nonvolatile memory card, and a ROM.

The functions of the above-described embodiments are realized when the computer executes the readout program codes. Also, the functions of the above-described embodiments are realized when an OS (Operating System), or the like, running on the computer performs a part of or all of actual processing on the basis of the instructions of the program codes.

The functions of the above-described embodiments are also realized when the program codes read out from the storage medium are written in the memory of a function expansion board inserted into the computer or the memory of a function expansion unit connected to the computer, and the CPU of the function expansion board or function expansion unit performs a part of or all of actual processing on the basis of the instructions of the program codes.

As has been described above, according to the present invention, an optimized parameter value by a given industrial device can be properly reflected in another industrial device, efficiently setting the parameter value in the entire system.

According to the present invention, the use of an operation result obtained by operating an industrial device using a parameter value other than a parameter value set for a predetermined parameter and a virtual operation result obtained by virtually changing the parameter allows optimizing the parameter value during volume production by the industrial device, and properly reflecting the parameter value in another industrial device. The parameter value of the industrial device can be easily optimized without decreasing the productivity in volume production. The effective performance of the apparatus increases, resulting in high productivity and high yield.

As many apparently widely different embodiments of the present invention can be made without departing from the spirit and scope thereof, it is to be understood that the invention is not limited to the specific embodiments thereof except as defined in the claims.

What is claimed is:

1. A management apparatus for managing a plurality of exposure apparatuses, said management apparatus comprising:
    determination means for determining how a change in a value of a first parameter, regarding an exposure operation, to be set in one of the plurality of exposure apparatuses is to be reflected to a change in a value of a second parameter, regarding the exposure operation, to be set in at least one remaining exposure apparatus of the plurality of exposure apparatuses, based on characteristic information of the at least one remaining exposure apparatus; and
    reflection means for reflecting the change in the value of the first parameter to the change in the value of the second parameter in accordance with a determination result of said determination means.

2. An apparatus according to claim 1, wherein said determination means determines whether the change in the value of the first parameter is to be reflected to the change in the value of the second parameter, based on the characteristic information.

3. An apparatus according to claim 1, wherein said determination means determines the value of the second parameter, based on the characteristic information.

4. An apparatus according to claim 1, further comprising a storage unit to store the characteristic information with respect to each of the plurality of exposure apparatuses.

5. An apparatus according to claim 1, further comprising change means for changing the value of the first parameter to be set in the one of the plurality of exposure apparatuses.

6. Am apparatus according to claim 5, wherein said change means changes the value of the first parameter based on first measurement data obtained by the one of the plurality of exposure apparatuses using a first value as the value of the first parameter, second measurement data obtained by the one of the plurality of exposure apparatuses using a second value as the value of the first parameter, and examination data with respect to a pattern obtained through exposure performed by the one of the plurality of exposure apparatuses based on the first measurement data.

7. An apparatus according to claim 1, wherein the characteristic information concerns a characteristic of an alignment measurement optical system in the exposure apparatus.

8. An apparatus according to claim 7, wherein the characteristic comprises at least one of a coma, spherical aberration, astigmatism, chromatic image shift and telecentricity.

9. An apparatus according to claim 1, wherein said determination means determines how the change in the value of the first parameter is to be reflected to the change in the value of the second parameter further based on characteristic information of the one of the plurality of exposure apparatuses.

10. An apparatus according to claim 2, wherein said determination means determines whether the change in the value of the first parameter is to be reflected to the change in the value of the second parameter further based on characteristic information of the one of the plurality of exposure apparatuses.

11. An apparatus according to claim 1, wherein said determination means determines the value of the second parameter further based on characteristic information of the one of the plurality of exposure apparatuses.

12. An apparatus according to claim 1, further comprising a network to which the plurality of exposure apparatuses connect.

13. A method of manufacturing a device, said method comprising steps of:
    exposing a substrate to a pattern using an exposure apparatus managed by a management apparatus as defined in claim 1;
    developing the exposed substrate; and
    processing the developed substrate to manufacture a device.

14. A computer-implemented method of managing a plurality of exposure apparatuses, said method comprising steps of:
    determining how a change in a value of a first parameter, regarding an exposure operation, to be set in one of the plurality of exposure apparatuses is to be reflected to a change in a value of a second parameter, regarding the exposure operation, to be set in at least one remaining exposure apparatus of the plurality of exposure apparatuses based on characteristic information of the at least one remaining exposure apparatus; and reflecting the change in the value of the first parameter to the change in the value of the second parameter in accordance with a determination result in said determining step.

15. A computer-readable medium storing software for causing a computer to execute a method of managing a plurality of exposure apparatuses, said method comprising steps of:
   determining how a change in a value of a first parameter, regarding an exposure operation, to be set in one of the plurality of exposure apparatuses is to be reflected to a change in a value of a second parameter, regarding the exposure operation, to be set in at least one remaining exposure apparatus of the plurality of exposure apparatuses based on characteristic information of the at least one remaining exposure apparatus; and
   reflecting the change in the value of the first parameter to the change in the value of the second parameter in accordance with a determination result in said determining step.

16. A management apparatus for managing a plurality of exposure apparatuses, said management apparatus comprising:
   a storage configured to store characteristic information of the plurality of exposure apparatuses; and
   a processor configured to determine how a change in a value of a first parameter, regarding an exposure operation, to be set in one of the plurality of exposure apparatuses is to be reflected to a change in a value of a second parameter, regarding the exposure operation, to be set in at least one remaining exposure apparatus of the plurality of exposure apparatuses, based on characteristic information of the at least one remaining exposure apparatus stored in said storage, and to reflect the change in the value of the first parameter ot the change in the value of the second parameter in accordance with the determination.

* * * * *

UNITED STATES PATENT AND TRADEMARK OFFICE
CERTIFICATE OF CORRECTION

PATENT NO. : 7,010,380 B2
APPLICATION NO. : 10/423891
DATED : March 7, 2006
INVENTOR(S) : Koichi Sentoku et al.

It is certified that error appears in the above-identified patent and that said Letters Patent is hereby corrected as shown below:

COLUMN 5:
Line 64, "($\gamma$)as" should read -- ($\gamma$) as --.

Signed and Sealed this

Fifteenth Day of August, 2006

JON W. DUDAS
*Director of the United States Patent and Trademark Office*